United States Patent
Baftiri et al.

(10) Patent No.: US 10,939,548 B2
(45) Date of Patent: Mar. 2, 2021

(54) COMPONENT CARRIER WITH IMPROVED TOUGHNESS FACTOR

(71) Applicant: AT&S (China) Co. Ltd., Shanghai (CN)

(72) Inventors: Artan Baftiri, Shanghai (CN); Mikael Tuominen, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/842,877

(22) Filed: Apr. 8, 2020

(65) Prior Publication Data

US 2020/0236781 A1    Jul. 23, 2020

Related U.S. Application Data

(63) Continuation of application No. 16/681,367, filed on Nov. 12, 2019, now Pat. No. 10,653,009.

(30) Foreign Application Priority Data

Nov. 21, 2018  (CN) .......................... 201821928593.8

(51) Int. Cl.
*H05K 1/03*  (2006.01)
*C08L 63/00*  (2006.01)
*H05K 1/18*  (2006.01)

(52) U.S. Cl.
CPC ............ *H05K 1/0373* (2013.01); *C08L 63/00* (2013.01); *H05K 1/188* (2013.01)

(58) Field of Classification Search
CPC .................. H05K 1/0373; H05K 1/188; H05K 2201/068; H05K 2201/0209; H05K 1/185; C08L 63/00

USPC .................................................. 174/256, 258
See application file for complete search history.

(56) References Cited

U.S. PATENT DOCUMENTS

| | | | |
|---|---|---|---|
| 2001/0053820 A1 | 12/2001 | Yeager et al. | |
| 2009/0293271 A1 | 12/2009 | Tanaka | |
| 2012/0142820 A1 | 6/2012 | Yamagichi et al. | |
| 2013/0081861 A1* | 4/2013 | Harazono | H05K 1/0366 174/255 |
| 2013/0081866 A1* | 4/2013 | Furutani | H01L 23/49822 174/260 |

(Continued)

FOREIGN PATENT DOCUMENTS

CN          1610103 A        4/2005

OTHER PUBLICATIONS

Engineering ToolBox, (2003); Coefficients of Linear Thermal Expansion; [online] Available at https://www.engineeringtoolbox.com/linearexpansion-coefficients-d_95.html [Accessed Nov. 12, 2019.].

(Continued)

*Primary Examiner* — Sherman Ng
(74) *Attorney, Agent, or Firm* — Robert A. Blaha; Smith Tempel Blaha LLC (57) ABSTRACT

A component carrier is provided, which includes a stack having at least one electrically conductive layer structure and/or at least one electrically insulating layer structure; a component on the stack; and stress propagation suppressing particles in at least part of the stack suppressing propagation of stress through the component carrier.

20 Claims, 1 Drawing Sheet

(56) References Cited

U.S. PATENT DOCUMENTS

| | | | |
|---|---|---|---|
| 2014/0144686 A1* | 5/2014 | Shimizu | H01L 23/5384 |
| | | | 174/258 |
| 2014/0151100 A1* | 6/2014 | Yu | H05K 1/185 |
| | | | 174/258 |
| 2014/0186593 A1 | 7/2014 | Seo et al. | |
| 2015/0163919 A1* | 6/2015 | Nakagome | H01L 23/49827 |
| | | | 174/255 |
| 2015/0305154 A1* | 10/2015 | Hayashi | H05K 1/112 |
| | | | 174/260 |

OTHER PUBLICATIONS

Engineering ToolBox, (2003); Coefficients of Linear Thermal Expansion; [online] Available at https://www.engineeringtollbox.com/linearexpansion-coefficients-d_95.html [Accessed Nov. 12, 2019].
ASM Ready Reference: Thermal Properties of Metals (#06702G), CHapter 2—Thermal Expansion, pp. 1-3, 2002, ASM International, Materials Park, Ohio, U.S.A.
Laser and Optics User's Manual, Chapter 17—Material Expansion Coefficients—Linear Thermal Expansion Coefficients of Metals and Alloys; 2002; pp. 1-12; Agilent Technologies, Santa Clara, CA, U.S.A.

* cited by examiner

COMPONENT CARRIER WITH IMPROVED TOUGHNESS FACTOR

CROSS-REFERENCE TO RELATED APPLICATION

This application claims the benefit of the filing date of Chinese Utility Model Application No. 201821928593.8, filed Nov. 21, 2018, the disclosure of which is hereby incorporated herein by reference.

TECHNICAL FIELD

Embodiments of the invention relate to a component carrier. In particular, embodiments of the invention relate to a component carrier having an improved toughness factor.

TECHNOLOGICAL BACKGROUND

In the context of growing product functionalities of component carriers equipped with one or more components and increasing miniaturization of such components as well as a rising number of components to be mounted on component carriers such as printed circuit boards (PCBs), increasingly more powerful array-like components or packages having several components are being employed, which have a plurality of contacts or connections, with ever smaller spacing between these contacts. Temperature changes, for instance resulting from heat generated by the components and/or from environmental influences (e.g. solar irradiation, coldness) become a more and more challenging issue for such miniaturized component carriers. Repeated temperature changes or temperature cycles may lead to mechanical stress within the component carrier, in particular between materials exhibiting significantly different thermal expansion characteristics. As a result of such mechanical stress, the toughness of the component carrier may be impaired and/or cracks may occur within the component carrier.

SUMMARY

There may be a need to provide a component carrier with an improved toughness factor and/or improved resistance to repeated temperature changes.

A component carrier according to the independent claim is provided.

According to an exemplary embodiment of the invention, a component carrier is provided, which comprises a stack comprising at least one electrically conductive layer structure and/or at least one electrically insulating layer structure, a component on the stack, and stress propagation suppressing particles (which may also be referred herein as "crack propagation reducing particles" or simply as "filler particles") in at least part of the stack suppressing propagation of stress (in particular reducing the propagation of cracks and/or increasing the required energy level for stress propagation) through the component carrier.

OVERVIEW OF EMBODIMENTS

In the context of the present application, the term "stress propagation suppressing particles" may particularly denote particles of any shape which are capable of suppressing propagation of stress through the component carrier and/or which are capable of compensating (or reducing) a difference in thermal expansion between materials, in particular between material of the stack (such as electrically conductive material and/or electrically insulating material) and material of the component (such as silicon). More specifically, stress propagation suppressing particles may be capable of adjusting or amending thermal expansion characteristics (e.g. a coefficient of thermal expansion (CTE) value) of a first material in which they are contained such that the difference between the thermal expansion characteristics of the first material approaches or is rendered similar, preferably substantially identical, to the thermal expansion characteristics of a second material (which may or may not comprise stress propagation suppressing particles) adjacent to the first material. Hence, by appropriately selecting the type and/or the amount of stress propagation suppressing particles, it may be possible to substantially suppress mechanical stress within the component carrier (in particular the propagation of stress through the component carrier) resulting from repeated temperature changes or temperature cycles.

In the following, further exemplary embodiments of the component carrier as well as of a method of manufacturing a component carrier and a method of using filler particles will be explained. However, the present invention is not limited to the following specific descriptions of exemplary embodiments, but they are rather for illustrative purposes only.

It should be noted that features described in connection with one exemplary embodiment or exemplary aspect may be combined with any other exemplary embodiment or exemplary aspect, in particular features described with any exemplary embodiment of a component carrier may be combined with any other exemplary embodiment of a component carrier and any exemplary embodiment of a method of manufacturing a component carrier and a method of using filler particles and vice versa, unless specifically stated otherwise.

Where an indefinite or definite article is used when referring to a singular term, such as "a", "an" or "the", a plural of that term is also included and vice versa, unless specifically stated otherwise, whereas the word "one" or the number "1", as used herein, typically means "just one" or "exactly one".

It should be noted that the term "comprising" does not exclude other elements or steps and, as used herein, includes not only the meaning of "comprising", "including" or "containing", but also encompasses "consisting essentially of" and "consisting of".

Unless specifically stated otherwise, the expressions "at least partially", "at least partly", "at least part of" or "at least a part of", as used herein, may mean at least 1% thereof, in particular at least 5% thereof, in particular at least 10% thereof, in particular at least 15% thereof, in particular at least 20% thereof, in particular at least 25% thereof, in particular at least 30% thereof, in particular at least 35% thereof, in particular at least 40% thereof, in particular at least 45% thereof, in particular at least 50% thereof, in particular at least 55% thereof, in particular at least 60% thereof, in particular at least 65% thereof, in particular at least 70% thereof, in particular at least 75% thereof, in particular at least 80% thereof, in particular at least 85% thereof, in particular at least 90% thereof, in particular at least 95% thereof, in particular at least 98% thereof, and may also include 100% thereof.

In an embodiment, the stress propagation suppressing particles are filler particles configured for reducing (in particular for compensating) a difference in thermal expansion between material of the stack and material of the component. This may provide the advantage that upon thermal impact, such as heating or cooling, the material of the stack (such as electrically conductive material and/or electrically insulating material) and the material of the component (such as silicon) may expand or shrink to a similar or substantially same degree, thereby reducing (in particular suppressing or avoiding) mechanical stress resulting from differently expanding or shrinking materials. As a result, the occurrence of cracks and/or warpage of the component carrier may be reduced (in particular suppressed or avoided). For example, if material of the stack (such as electrically conductive material and/or electrically insulating material) has a smaller coefficient of thermal expansion (CTE) value than material of the component (such as silicon), filler particles may be selected which increase the (overall) CTE value of stack material including the filler particles. On the other hand, if material of the stack (such as electrically conductive material and/or electrically insulating material) has a larger coefficient of thermal expansion (CTE) value than material of the component (such as silicon), filler particles may be selected which reduce the (overall) CTE value of stack material including the filler particles.

In an embodiment, the stress propagation suppressing particles are filler particles comprising a dielectric material. Dielectric materials may provide for a particular suitable thermal expansion compensation and/or stress propagation suppressing effect. In addition, filler particles comprising a dielectric material may be contained in electrically insulating material without significantly impairing its electrically insulating properties. In other words, by using filler particles comprising a dielectric material it may be avoided that the electrically insulating material becomes electrically conductive. On the other hand, filler particles comprising a dielectric material may also be contained in electrically conductive material without significantly impairing its electrically conductive properties. Thus, filler particles comprising a dielectric material may be versatilely utilized both in an electrically insulating material and/or in an electrically conductive material of a stack of a component carrier.

In an embodiment, the stress propagation suppressing particles are filler particles comprising a ceramic material (such as quartz or aluminum oxide) and/or an amorphous material (such as glass). Ceramic materials and/or amorphous materials may provide for a particular suitable thermal expansion compensation and/or stress propagation suppressing effect. In addition, filler particles comprising a ceramic material and/or an amorphous material may be contained in electrically insulating material without significantly impairing its electrically insulating properties. In other words, by using filler particles comprising a ceramic material and/or an amorphous material it may be avoided that the electrically insulating material becomes electrically conductive. On the other hand, filler particles comprising a ceramic material and/or an amorphous material may also be contained in electrically conductive material without significantly impairing its electrically conductive properties. Thus, filler particles comprising a ceramic material and/or an amorphous material may be versatilely utilized both in an electrically insulating material and/or in an electrically conductive material of a stack of a component carrier.

In an embodiment, the stress propagation suppressing particles are filler particles comprising at least one selected from the group consisting of quartz, aluminum oxide or glass. These are particularly suitable examples for materials for providing a thermal expansion compensation and/or stress propagation suppressing effect and which may be versatilely utilized both in an electrically insulating material and/or in an electrically conductive material of a stack of a component carrier.

In an embodiment, the stress propagation suppressing particles or filler particles are made of a material other than the material of the at least part of the stack comprising the stress propagation suppressing particles. In other words, the stress propagation suppressing particles or filler particles may be made of a different material than the material of the at least part of the stack (for instance the material of the electrically conductive layer structure and/or the material of the at least one electrically insulating layer structure) comprising the stress propagation suppressing particles.

In an embodiment, the stress propagation suppressing particles are filler particles having an average particle size (or average particle diameter) in a range of from 15 nm to 20 µm, in particular between 15 nm and 20 µm. For instance, the average particle size of the filler particles may be in a range of from 25 nm to 15 µm, such as from 50 nm to 10 µm, such as from 100 nm to 5 µm, such as from 250 nm to 2.5 µm, such as from 500 nm to 1 µm. The determination of an average particle size (or average particle diameter) is known to a person skilled in the art and can be performed for instance by visual microscopic observation with an appropriate magnification, for instance by using an electron microscope (such as a transmission electron microscope, TEM) and by randomly selecting an appropriate number of particles and calculating the average of the individual particle diameters. The determination of an average particle size (or average particle diameter) can also be performed for instance using light diffraction, for instance dynamic light scattering, for instance using X-ray diffraction, of an appropriate sample size and particle concentration.

The shape of the stress propagation suppressing particles or filler particles is not particularly limited, and any shape thereof, such as spherical, polyhedral, regular or irregular, may be suitable.

The stress propagation suppressing particles or filler particles may be of a core/shell type or the stress propagation suppressing particles or filler particles may have a homogeneous (uniform) constitution.

In an embodiment, a volume percentage of stress propagation suppressing particles in the at least part of the stack comprising the stress propagation suppressing particles is from 30% to 95%, such as from 40% to 90%, in particular from 50% to 80%. By taking this measure, an appropriate thermal expansion compensation and/or stress propagation suppressing effect may be achieved. In addition, a volume percentage of stress propagation suppressing particles as described above contained in electrically insulating material and/or electrically conductive material may maintain its respective electrically insulating properties and/or electrically conductive properties.

In an embodiment, the electrically insulating layer structure has a coefficient of thermal expansion (CTE) value below 30 ppm/° C., in particular below 15 ppm/° C. On the other hand, the electrically insulating layer structure may have a coefficient of thermal expansion (CTE) value of more than 0.5 ppm/° C., in particular more than 1 ppm/° C. By taking this measure, a particular efficient thermal expansion compensation and/or stress propagation suppressing effect may be achieved by stress propagation suppressing particles contained in such electrically insulating layer structure.

In an embodiment, (the whole or at least part of the) stress propagation suppressing particles are contained in at least part of at least one electrically insulating layer structure. This may be advantageous if particularly at least part of the at least one electrically insulating layer structure exhibits a substantial difference in CTE value with regard to material of the component.

In an embodiment, (the whole or at least part of the) stress propagation suppressing particles are contained in at least part of at least one electrically conductive layer structure. This may be advantageous if particularly at least part of the at least one electrically conductive layer structure exhibits a substantial difference in CTE value with regard to material of the component.

In an embodiment, (the whole or at least part of the) stress propagation suppressing particles are contained in at least part of electrically conductive connections, in particular electrically conductive connections to the component. This may be advantageous if particularly at least part of the electrically conductive connections, in particular the electrically conductive connections to the component, exhibits a substantial difference in CTE value with regard to material of the component. Electrically conductive connections may be considered as a part of the electrically conductive layer structures. Electrically conductive connections to the component may be portions of electrically conductive material in close proximity, in particular in physical contact, to the components. Electrically conductive connections to the component may be provided at at least one, two, three, four five or all six sides of the component.

In an embodiment, the component is at least partially surrounded by the stress propagation suppressing particles. For instance, at least one, two, three, four or five sides of the component are surrounded by the stress propagation suppressing particles. By taking this measure, a thermal expansion compensation and/or stress propagation suppressing effect resulting from the provision of stress propagation suppressing particles may be tailored according to the actual needs, in particular only at that positions or sides of the components where a particular difference in thermal expansion characteristics occurs and/or which are particularly prone to mechanical stress or cracks.

In an embodiment, the component is substantially completely surrounded by the stress propagation suppressing particles. By taking this measure, a particular complete and efficient thermal expansion compensation and/or stress propagation suppressing effect may be achieved.

In an embodiment, the component is (at least partially or even completely) embedded within the stack comprising at least one electrically conductive layer structure and/or at least one electrically insulating layer structure.

In an embodiment, (the whole or at least part of the) stress propagation suppressing particles are contained in at least part of at least one electrically insulating layer structure and in at least part of at least one electrically conductive layer structure. This may be advantageous if particularly at least part of the at least one electrically insulating layer structure and at least part of the at least one electrically conductive layer structure exhibit a substantial difference in CTE value with regard to material of the component.

In an embodiment, (the whole or at least part of the) stress propagation suppressing particles are contained in at least part of at least one electrically conductive layer structure and in at least part of electrically conductive connections, in particular electrically conductive connections to the component. This may be advantageous if particularly at least part of the at least one electrically conductive layer structure and at least part of the electrically conductive connections, in particular the electrically conductive connections to the component, exhibit a substantial difference in CTE value with regard to material of the component.

In an embodiment, (the whole or at least part of the) stress propagation suppressing particles are contained in at least part of at least one electrically insulating layer structure, in at least part of at least one electrically conductive layer structure and in at least part of electrically conductive connections, in particular electrically conductive connections to the component. This may be advantageous if particularly at least part of the at least one electrically insulating layer structure, at least part of the at least one electrically conductive layer structure and at least part of the electrically conductive connections, in particular the electrically conductive connections to the component, exhibit a substantial difference in CTE value with regard to material of the component.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of a group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing particles (such as reinforcing spheres, in particular glass spheres).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up material (such as epoxy-based build-up film), polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of a group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

In an embodiment, the substrate or interposer may consist of at least a layer of glass, silicon (Si) or a photo-imageable or dry-etchable organic material like epoxy-based build-up films or polymer compounds like polyimide, polybenzoxazole, or benzocyclobutene.

According to another exemplary embodiment, a method of manufacturing a component carrier is provided. The method comprises the steps of forming a stack comprising at least one electrically conductive layer structure and/or at least one electrically insulating layer structure, embedding a component on the stack and providing at least part of the stack with stress propagation suppressing particles (also referred to herein as "filler particles") suppressing propagation of stress through the component carrier.

In an embodiment, at least part of the stress propagation suppressing particles are applied in/during the embedding step. In particular, the filler particles may be used in the step of embedding. By taking this measure, it may be possible to (selectively) provide at least one electrically conductive layer structure and/or at least part of electrically conductive connections, in particular electrically conductive connections to the component, with stress propagation suppressing particles or filler particles.

In an embodiment, at least part of the stress propagation suppressing particles are provided to the electrically insulating layer structure in advance. Similarly, the stress propagation suppressing particles or filler particles may pre-exist in the material of the electrically insulating layer structure. By taking this measure, it may be possible to (selectively) provide at least part of at least one electrically insulating layer structure (such as a central core sandwiched between electrically conductive layer structures) with stress propagation suppressing particles or filler particles.

In an embodiment, the filler particles may be used on both layers or sides of the embedded component (with any type of core, i.e. including core material (at least partially) filled with stress propagation suppressing particles and/or free of stress propagation suppressing particles).

According to yet another exemplary embodiment, a method of using filler particles for suppressing propagation of cracks within a component carrier having an embedded component is provided.

DETAILED DESCRIPTION OF ILLUSTRATED EMBODIMENTS

The aspects defined above and further aspects of the application are apparent from the exemplary embodiments to be described hereinafter and are explained with reference to these exemplary embodiments.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier comprising a stack of electrically conductive layer structure and/or electrically insulating layer structures and a component on the stack comprises stress propagation suppressing particles in at least part of the stack suppressing propagation of stress through the component carrier. The stress propagation suppressing particles may provide a thermal expansion compensation and/or stress propagation suppressing effect by compensating (or reducing) a difference in thermal expansion between materials, in particular between material of the stack (such as electrically conductive material and/or electrically insulating material) and material of the component (such as silicon). More specifically, the stress propagation suppressing particles may adjust or modify thermal expansion characteristics (e.g. a coefficient of thermal expansion (CTE) value) of a first material in which they are contained such that the difference between the thermal expansion characteristics of the first material approaches or is rendered similar, preferably substantially identical, to the thermal expansion characteristics of a second material (which may or may not comprise stress propagation suppressing particles) adjacent to the first material. As a result, by appropriately selecting the type and/or the amount of stress propagation suppressing particles, it could be achieved to substantially suppress any mechanical stress within the component carrier (in particular the propagation of stress through the component carrier) resulting from repeated temperature changes or temperature cycles exerted on the component carrier.

In particular, the stress propagation suppressing particles may be filler particles which may reduce (in particular compensate or balance) a difference in thermal expansion between material of the stack and material of the component. This may provide the advantage that upon thermal impact (both internally and externally) on the component carrier, such as a frequent heating or cooling of the component carrier, the material of the stack (such as electrically conductive material and/or electrically insulating material) and the material of the component (such as silicon) may expand or shrink to a similar or substantially same degree, thereby reducing (in particular suppressing or avoiding) mechanical stress resulting from differently expanding or shrinking materials. As a result, the occurrence of cracks and/or warpage of the component carrier may be reduced (in particular suppressed or avoided). For example, if material of the stack (such as electrically conductive material and/or electrically insulating material) has a smaller coefficient of thermal expansion (CTE) value than material of the component (such as silicon), filler particles may be selected which increase the (overall) CTE value of stack material including the filler particles. On the other hand, if material of the stack (such as electrically conductive material and/or electrically insulating material) has a larger coefficient of thermal expansion (CTE) value than material of the component (such as silicon), filler particles may be selected which reduce the (overall) CTE value of stack material including the filler particles.

Figure 1:
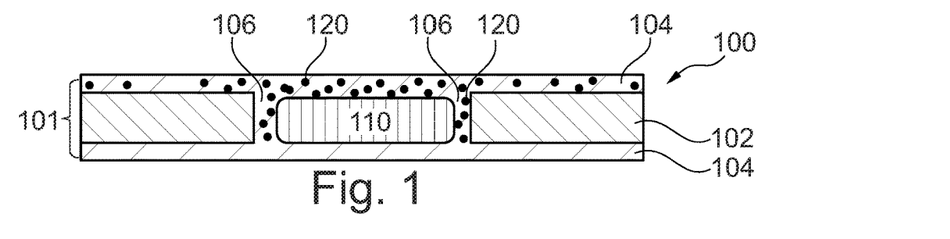
FIG. 1 illustrates a component carrier according to an exemplary embodiment of the invention.

FIG. 1 illustrates a component carrier 100 according to an exemplary embodiment of the invention. The component carrier 100 comprises a stack 101 comprising at least one electrically conductive layer structure 104, which is embodied in the depicted embodiment as an upper and a lower electrically conductive layer structure 104, and at least one electrically insulating layer structure 102, which is embodied in the depicted embodiment as a central core sandwiched between the upper and lower electrically conductive layer structures 104. The component carrier 100 further comprises a component 110, which is completely embedded within the stack 101 of the electrically insulating layer structure 102 and the electrically conductive layer structures 104 in the depicted embodiment. In alternative embodiments, the component 110 may also be only partly embedded within the stack 101 of electrically insulating layer structure 102 and the electrically conductive layer structures 104 or may be surface-mounted, for instance on a surface of an electrically conductive layer structure 104.

In the depicted embodiment, the component carrier 100, more specifically the stack 101, further comprises electrically conductive connections 106 (which may be considered as a part of the electrically conductive layer structures 104), which are provided in proximity or adjacent to the component 110 and may therefore also be referred to as electrically conductive connections 106 to the component 110.

In the embodiment shown in FIG. 1, the component carrier 100 further comprises stress propagation suppressing particles 120 or filler particles 120 in at least part of the stack 101. More specifically, in the embodiment shown in FIG. 1, stress propagation suppressing particles 120 or filler particles 120 are provided in at least part of the electrically conductive layer structures 104 and of the electrically conductive connections 106. Still further specifically, in the embodiment shown in FIG. 1, stress propagation suppressing particles 120 or filler particles 120 are provided in only a part of the electrically conductive layer structures 104 (such as in the upper electrically conductive layer structure 104) and in the electrically conductive connections 106, but not in the electrically insulating layer structure 102. Such configuration may be advantageous if particularly at least part of the at least one electrically conductive layer structure 104 and at least part of the electrically conductive connections 106 exhibit a substantial difference in CTE value with regard to material of the component 110. Moreover, such configuration may be obtained for instance by applying the filler particles 120 in the process of embedding itself.

Figure 2:
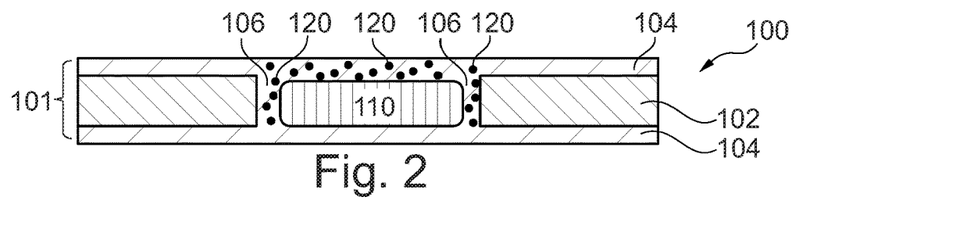
FIG. 2 illustrates a component carrier according to another exemplary embodiment of the invention.

FIG. 2 illustrates a component carrier 100 according to another exemplary embodiment of the invention. The component carrier 100 according to the exemplary embodiment of the invention shown in FIG. 2 may substantially correspond to the component carrier 100 according to the exemplary embodiment of the invention shown in FIG. 1, apart from the location of stress propagation suppressing particles 120 or filler particles 120, so that the description of like elements is not repeated.

In the embodiment shown in FIG. 2, the component carrier 100 comprises stress propagation suppressing particles 120 or filler particles 120 in at least part of the electrically conductive connections 106. More specifically, in the embodiment shown in FIG. 2, stress propagation suppressing particles 120 or filler particles 120 are provided only in a part of the electrically conductive connections 106 (which may be considered as a part of the electrically conductive layer structures 104), but not in the electrically insulating layer structure 102. Such configuration may be advantageous if particularly at least part of the electrically conductive connections 106 exhibits a substantial difference in CTE value with regard to material of the component 110. Moreover, such configuration may be obtained for instance by applying the filler particles 120 in the process of embedding itself.

Figure 3:
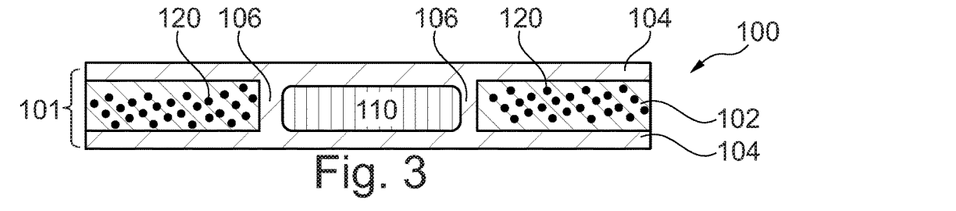
FIG. 3 illustrates a component carrier according to still another exemplary embodiment of the invention.

FIG. 3 illustrates a component carrier 100 according to still another exemplary embodiment of the invention. The component carrier 100 according to the exemplary embodiment of the invention shown in FIG. 3 may substantially correspond to the component carrier 100 according to the exemplary embodiment of the invention shown in FIG. 1, apart from the location of stress propagation suppressing particles 120 or filler particles 120, so that the description of like elements is not repeated.

In the embodiment shown in FIG. 3, the component carrier 100 comprises stress propagation suppressing particles 120 or filler particles 120 in (at least part of) the electrically insulating layer structure 102. More specifically, in the embodiment shown in FIG. 3, stress propagation suppressing particles 120 or filler particles 120 are provided only in the (substantially entire) electrically insulating layer structure 102, but not in the electrically conductive layer structures 104 or the electrically conductive connections 106. Such configuration may be advantageous if particularly at least part of the electrically insulating layer structure 102 exhibits a substantial difference in CTE value with regard to material of the component 110 and/or with regard to material of the electrically conductive layer structures 104. Moreover, such configuration may be obtained for instance by providing filler particles 120 to the core material of the electrically insulating layer structure 102 in advance or if filler particles 120 pre-exist in the core material of the electrically insulating layer structure 102.

Figure 4:
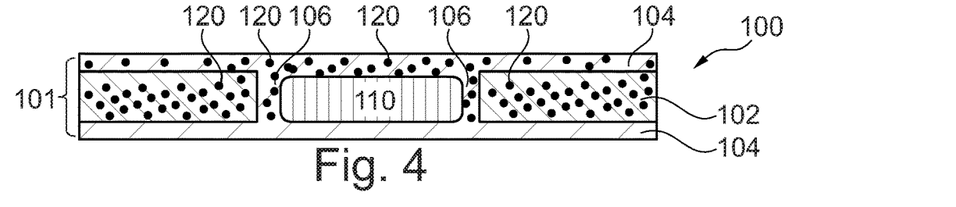
FIG. 4 illustrates a component carrier according to still another exemplary embodiment of the invention.

FIG. 4 illustrates a component carrier 100 according to still another exemplary embodiment of the invention. The component carrier 100 according to the exemplary embodiment of the invention shown in FIG. 4 may substantially correspond to the component carrier 100 according to the exemplary embodiment of the invention shown in FIG. 1, apart from the location of stress propagation suppressing particles 120 or filler particles 120, so that the description of like elements is not repeated.

In the embodiment shown in FIG. 4, the component carrier 100 comprises stress propagation suppressing particles 120 or filler particles 120 in (at least part of) the electrically insulating layer structure 102, in at least part of the electrically conductive layer structures 104 and in at least part of the electrically conductive connections 106. More specifically, in the embodiment shown in FIG. 4, stress propagation suppressing particles 120 or filler particles 120 are provided in only a part of the electrically conductive layer structures 104 (such as in the upper electrically conductive layer structure 104), in the (substantially entire) electrically insulating layer structure 102 and in a part of the electrically conductive connections 106. Such configuration may be advantageous if particularly at least part of the at least one electrically insulating layer structure 102, at least part of the at least one electrically conductive layer structure 104 and at least part of the electrically conductive connections 106 exhibit a substantial difference in CTE value with regard to material of the component 110. Moreover, such configuration may be obtained for instance by providing filler particles 120 to the core material of the electrically insulating layer structure 102 in advance or if filler particles 120 pre-exist in the core material of the electrically insulating layer structure 102, and by applying the filler particles 120 in the process of embedding itself.

Figure 5:
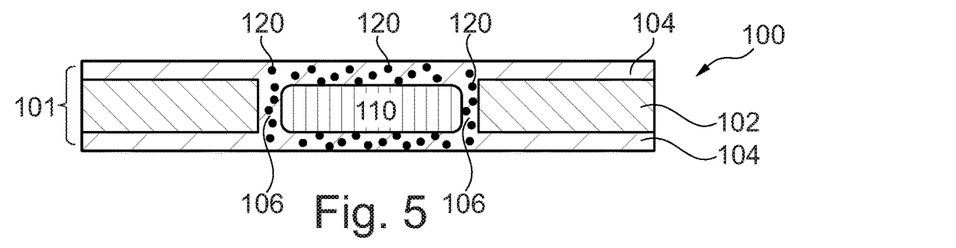
FIG. 5 illustrates a component carrier according to still another exemplary embodiment of the invention.

FIG. 5 illustrates a component carrier 100 according to still another exemplary embodiment of the invention. The component carrier 100 according to the exemplary embodiment of the invention shown in FIG. 5 may substantially correspond to the component carrier 100 according to the exemplary embodiment of the invention shown in FIG. 1, apart from the location of stress propagation suppressing particles 120 or filler particles 120, so that the description of like elements is not repeated.

In the embodiment shown in FIG. 5, the component carrier 100 comprises stress propagation suppressing particles 120 or filler particles 120 in (at least part of) the electrically conductive connections 106. More specifically, in the embodiment shown in FIG. 5, stress propagation suppressing particles 120 or filler particles 120 are provided only in the (substantially entire) electrically conductive connections 106 (which may considered as a part of the electrically conductive layer structures 104), but not in the electrically insulating layer structure 102. Such configuration may be advantageous if particularly the electrically conductive connections 106 exhibit a substantial difference in CTE value with regard to material of the component 110.

Figure 6:
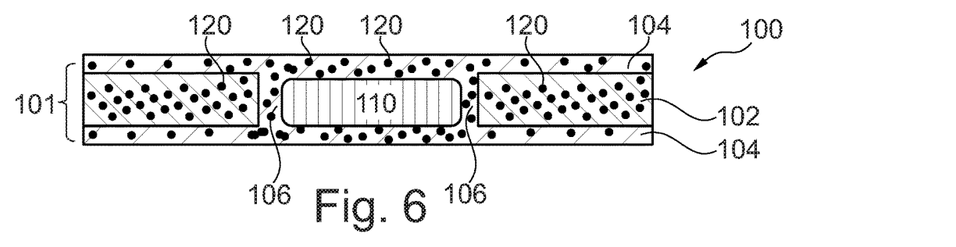
FIG. 6 illustrates a component carrier according to still another exemplary embodiment of the invention.

FIG. 6 illustrates a component carrier 100 according to still another exemplary embodiment of the invention. The component carrier 100 according to the exemplary embodiment of the invention shown in FIG. 6 may substantially correspond to the component carrier 100 according to the exemplary embodiment of the invention shown in FIG. 1, apart from the location of stress propagation suppressing particles 120 or filler particles 120, so that the description of like elements is not repeated.

In the embodiment shown in FIG. 6, the component carrier 100 comprises stress propagation suppressing particles 120 or filler particles 120 in (at least part of) the electrically insulating layer structure 102, in (at least part of) the electrically conductive layer structures 104 and in (at least part of) the electrically conductive connections 106. More specifically, in the embodiment shown in FIG. 6, stress propagation suppressing particles 120 or filler particles 120 are provided substantially in the (substantially entire) electrically conductive layer structures 104 (i.e. in both the upper and the lower electrically conductive layer structures 104), in the (substantially entire) electrically insulating layer structure 102 and in the (substantially entire) electrically conductive connections 106. Such configuration may be advantageous if particularly all of the at least one electrically insulating layer structure 102, the at least one electrically conductive layer structure 104 and the electrically conductive connections 106 exhibit a substantial difference in CTE value with regard to material of the component 110.

Implementation of the invention is not limited to the preferred embodiments shown in the figures and described above. Instead, a multiplicity of variants is possible which use the solutions shown and the principle according to the invention even in the case of fundamentally different embodiments.

REFERENCE SIGNS

100 Component carrier
101 Stack
102 Electrically insulating layer structure
104 Electrically conductive layer structure
106 Electrically conductive connections
110 Component
120 Stress propagation suppressing particles/Filler particles

The invention claimed is:

1. A component carrier, comprising:
   a stack comprising at least one electrically conductive layer structure and/or at least one electrically insulating layer structure; and
   a component on or in the stack;
   wherein stress propagation suppressing particles suppressing propagation of stress through the component carrier are contained in at least part of at least one electrically conductive layer structure.

2. The component carrier according to claim 1, wherein the stress propagation suppressing particles are filler particles configured for reducing a difference in thermal expansion between material of the stack and material of the component.

3. The component carrier according to claim 1, wherein the stress propagation suppressing particles are filler particles comprising a dielectric material.

4. The component carrier according to claim 1, wherein the stress propagation suppressing particles are filler particles comprising a ceramic material and/or an amorphous material.

5. The component carrier according to claim 1, wherein the stress propagation suppressing particles are filler particles comprising at least one selected from the group consisting of quartz, aluminum oxide or glass.

6. The component carrier according to claim 1, wherein the stress propagation suppressing particles are filler particles having an average particle size in a range of from 15 μm to 20 μm.

7. The component carrier according to claim 1, wherein a volume percentage of stress propagation suppressing particles in the at least part of the stack comprising the stress propagation suppressing particles is from 30% to 95%.

8. The component carrier according to claim 1, wherein the electrically insulating layer structure has a coefficient of thermal expansion (CTE) value below 30 ppm/° C.

9. The component carrier according to claim 1, wherein stress propagation suppressing particles are contained in at least part of at least one electrically insulating layer structure.

10. The component carrier according to claim 1, wherein stress propagation suppressing particles are contained in at least part of electrically conductive connections, in particular electrically conductive connections to the component.

11. The component carrier according to claim 1, wherein the component is at least partially surrounded by the stress propagation suppressing particles.

12. The component carrier according to claim 1, wherein the component is mounted on and/or embedded in the at least one electrically insulating layer structure and/or at least one electrically conductive layer structure.

13. The component carrier according to claim 1, wherein the component is selected from a group consisting of an electronic component, an electrically non-conductive and/or electrically conductive inlay, a heat transfer unit, a light guiding element, an active electronic component, a passive electronic component, an electronic chip, a storage device, a filter, an integrated circuit, a signal processing component, a power management component, an optoelectronic interface element, a light emitting diode, a photocoupler, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, a further component carrier and a logic chip, and an energy harvesting unit.

14. The component carrier according to claim 1, wherein the electrically conductive layer structures comprise at least one of a group consisting of copper, aluminum, nickel, silver, gold, palladium, and tungsten, any of the mentioned materials being optionally coated with supra-conductive material such as graphene.

15. The component carrier according to claim 1, wherein the at least one electrically insulating layer structure comprises at least one of a group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, epoxy-based build-up film, polytetrafluoroethylene, a ceramic, and a metal oxide.

16. The component carrier according to claim 1,
   wherein the component carrier is shaped as a plate; and/or
   wherein the component carrier is configured as one of a group consisting of a printed circuit board, and a substrate; and/or
   wherein the component carrier is configured as a laminate-type component carrier.

17. The component carrier according to claim 1, wherein the electrically insulating layer structure has a coefficient of thermal expansion value of more than 0.5 ppm/° C.

18. A component carrier, comprising:
   a stack including at least one electrically conductive layer structure and/or at least one electrically insulating layer structure; and
   a component on or in the stack;
   wherein stress propagation suppressing particles suppressing propagation of stress through the component carrier are contained in at least part of electrically conductive connections to the component.

19. The component carrier according to claim 18, wherein the stress propagation suppressing particles are filler particles configured for reducing a difference in thermal expansion between material of the stack and material of the component.

20. The component carrier according to claim 18, wherein the stress propagation suppressing particles are filler particles comprising a dielectric material.

\* \* \* \* \*